United States Patent
Shibata

(10) Patent No.: US 6,461,919 B1
(45) Date of Patent: Oct. 8, 2002

(54) METHOD FOR FABRICATING SEMICONDUCTOR DEVICE WITH DIFFERENT GATE OXIDE COMPOSITIONS

(75) Inventor: Yoshiyuki Shibata, Shiga (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/450,512

(22) Filed: Nov. 30, 1999

(30) Foreign Application Priority Data

Dec. 8, 1998 (JP) .......................................... 10-348240

(51) Int. Cl.$^7$ .................. H01L 21/8234; H01L 21/336; H01L 21/3205; H01L 21/31; H01L 21/469
(52) U.S. Cl. ....................... 438/275; 438/287; 438/591; 438/770; 438/785
(58) Field of Search ................................ 438/216, 240, 438/275, 287, 591, 770, 785, 786

(56) References Cited

U.S. PATENT DOCUMENTS

| | | | |
|---|---|---|---|
| 4,466,177 A | * | 8/1984 | Chao |
| 5,162,884 A | * | 11/1992 | Liou et al. |
| 5,731,239 A | * | 3/1998 | Wong et al. ................. 438/296 |
| 5,989,948 A | * | 11/1999 | Vines et al. ................. 438/216 |
| 6,066,521 A | * | 5/2000 | Yokoyama et al. ......... 438/202 |
| 6,225,168 B1 | * | 5/2001 | Gardner et al. ............. 438/287 |

* cited by examiner

*Primary Examiner*—Richard Booth
*Assistant Examiner*—Ron Pompey
(74) *Attorney, Agent, or Firm*—Nixon Peabody LLP; Donald R. Studebaker

(57) ABSTRACT

First, an isolation region is formed on a surface portion of a semiconductor substrate of silicon, thereby defining first and second regions, which are isolated from each other by the isolation region, on the semiconductor substrate. Next, a tantalum oxide film is formed in the first region on the semiconductor substrate. Then, a silicon dioxide film is formed in the second region on the semiconductor substrate by heat-treating the semiconductor substrate within an ambient containing oxygen as a main component. Subsequently, first and second gate electrodes are formed on the tantalum oxide and silicon dioxide films, respectively. Thereafter, first and second gate insulating films are formed by etching the tantalum oxide and silicon dioxide films using the first and second gate electrodes as respective masks.

3 Claims, 12 Drawing Sheets

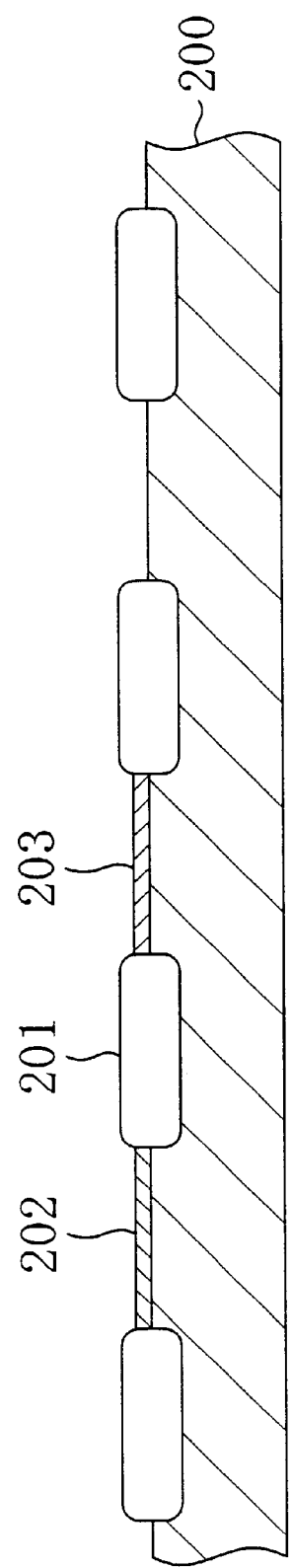

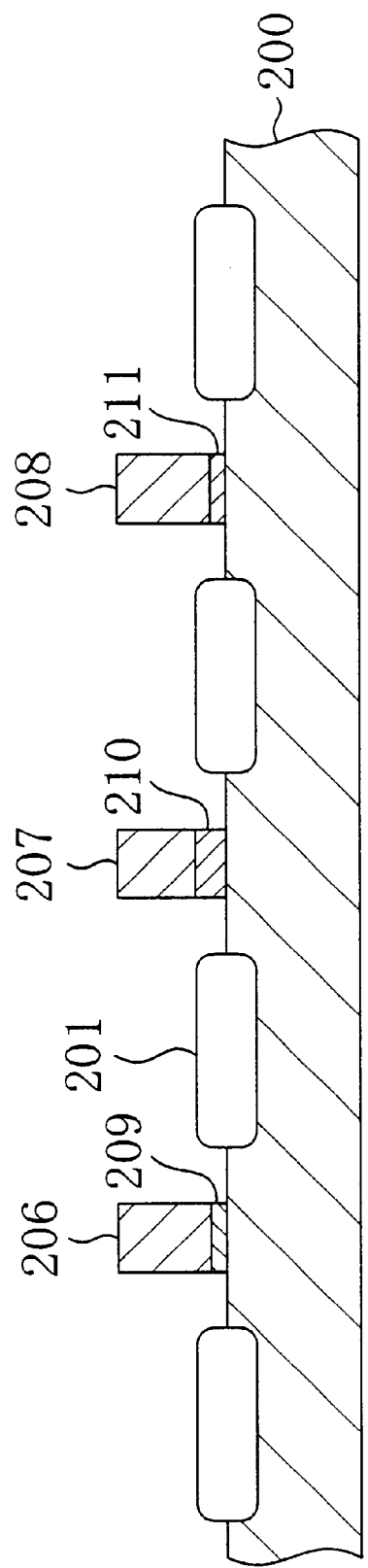

METHOD FOR FABRICATING SEMICONDUCTOR DEVICE WITH DIFFERENT GATE OXIDE COMPOSITIONS

BACKGROUND OF THE INVENTION

The present invention relates to a semiconductor device and a method for fabricating the same.

In recent years, semiconductor devices have been drastically downsized and increasingly required to perform an even wider variety of functions concurrently. Considering such a state of the art, it has become more and more necessary to change the thickness of a gate insulating film, which is provided for multiple MOS transistors on the same semiconductor substrate, from place to place. Specifically, to make all of these transistors operate reliably, the gate insulating film should be partially thickened for some transistors operating at relatively high voltages, but be partially thinned for other transistors operating at relatively low voltages. Another situation where the thickness of the gate insulating film has to be changed arises when several kinds of threshold voltages need to be prepared for these transistors.

In addition, as semiconductor devices have been miniaturized, the necessity of reducing the thickness of a gate insulating film has also been increasing day after day. For that purpose, according to a proposed technique, a thinner gate insulating film was provided by making the insulating film of tantalum oxide, which has a relative dielectric constant higher than that of a silicon dioxide film used conventionally. Specifically, the relative dielectric constant of the tantalum oxide film is about 25, whereas that of the conventional silicon dioxide film is about 3.9. Accordingly, the dielectric strength of the tantalum oxide film is about 6 times as high as that of the silicon dioxide film.

If a voltage as high as 1.5 V or more is applied to the gate electrode, however, then the tantalum oxide film is hard to use as the gate insulating film anymore in view of the leakage current characteristic thereof. Thus, in such a situation, two types of transistors, i.e., transistors including a tantalum oxide film as gate insulating film and transistors including a silicon dioxide film as gate insulating film, have to be formed on the same semiconductor substrate.

Hereinafter, a method for fabricating a semiconductor device, which includes a transistor with a silicon dioxide gate insulating film and a transistor with a tantalum oxide gate insulating film on the same semiconductor substrate, will be described as first prior art example with reference to FIGS. 11(a) through 11(d). In FIGS. 11(a) through 11(d), the tantalum oxide gate insulating film will be formed in a first region on the left-hand side, and the silicon dioxide gate insulating film will be formed in a second region on the right-hand side.

First, as shown in FIG. 11(a), isolation regions 11 are defined on the surface of a semiconductor substrate 10 of silicon, and then a tantalum oxide film 12 is deposited to a thickness of 10 nm, for example, in the first and second regions of the semiconductor substrate 10.

Next, as shown in FIG. 11(b), a mask 13 is made out of a silicon dioxide or resist film over the first region of the semiconductor substrate 10, and the tantalum oxide film 12 in the first region is etched away using the mask 13.

Then, as shown in FIG. 11(c), a silicon dioxide film 14 is formed to a thickness of 5 nm, for example, in the second region of the semiconductor substrate 10.

Subsequently, a conductor film is deposited over the tantalum oxide and silicon dioxide films 12 and 14 and then patterned into gate electrode shapes. In this manner, first and second gate electrodes 15 and 16 are formed on the tantalum oxide and silicon dioxide films 12 and 14, respectively, as shown in FIG. 11(d). Thereafter, the tantalum oxide and silicon dioxide films 12 and 14 are etched using the first and second gate electrodes 15 and 16 as respective masks, thereby forming first and second gate insulating films 17 and 18.

If the tantalum oxide film 12 is used as the gate insulating film, however, then a silicon dioxide film with a relative dielectric constant lower than that of the tantalum oxide film 12 is formed in the interface between the tantalum oxide film 12 and the semiconductor substrate 10 of silicon during a subsequent heat treatment process. As a result, the total relative dielectric constant of the gate insulating film adversely decreases.

An alternative method for fabricating a semiconductor device according to a second prior art example, which was proposed to avoid this problem, will be described with reference to FIG. 12. As shown in FIG. 12, before the tantalum oxide film 12 is deposited, the surface of the underlying semiconductor substrate 10 is nitrided at 900° C. for about 60 seconds within a rapid thermal annealing furnace, thereby forming a nitrogen-containing silicon layer 19 on the surface of the semiconductor substrate 10.

Also, just after the tantalum oxide film 12 has been deposited, the tantalum oxide film 12 is amorphous and contains a lot of carbon. For these and other reasons, the tantalum oxide film 12 as deposited should be subjected to oxidation or crystallization heat treatment. Furthermore, when the tantalum oxide film 12 is used as gate insulating film, the gate electrode is made of a metal such as Ti, W or TiSi$_x$. Thus, it is effective to deposit a TiN, WN or TaN film as barrier metal layer in the interface between the gate insulating film and the gate electrode.

The material of the silicon dioxide film has also been modified recently to cope with the demand for further reduction in thickness of the gate insulating film. Specifically, a silicon oxynitride film, which is obtained by introducing nitrogen into a silicon dioxide film, has been used more and more often instead of the silicon dioxide film essentially consisting of silicon and oxygen only. Examples of known methods for forming the silicon oxynitride film include: (1) forming a silicon dioxide film and then heat-treating it within an ammonium or nitrogen oxide ambient; (2) forming a silicon nitride film and then heat-treating it within an oxygen ambient; (3) conducting a heat treatment within an ambient in which nitrogen or ammonium and oxygen are mixed; and (4) directly heat-treating the surface of a silicon substrate, on which no film has been deposited yet, within a nitrogen oxide ambient.

In a storage capacitor portion of a semiconductor storage device such as DRAM, an ONO film, which is a stack of silicon dioxide and nitride films, has been used.

However, to cope with the downsizing of capacitors, a tantalum oxide film has recently attracted a lot of attention as a new material for a capacitive insulating film. If the tantalum oxide film is used as an insulating film for a storage capacitor portion, the tantalum oxide film has to be subjected to a nitriding or oxidation/crystallization process before or after the deposition as in the gate insulating film.

Also, a semiconductor storage device has been more and more required lately to process several information items at a time by using a plurality of regions with different quantities of charge.

If an MOS transistor with the silicon dioxide gate insulating film and another MOS transistor with the tantalum oxide gate insulating film are formed on the same semiconductor substrate in the above-described manner, then the number of masking process steps increases. In addition, since the heat treatment should be conducted separately to form the tantalum oxide and silicon dioxide films on the semiconductor substrate, the dopant introduced into the semiconductor substrate might diffuse excessively to affect the basic electrical characteristics of the transistors. As a result, it is difficult to ensure desired performance because MOS transistors of a very small size cannot be formed in such a case.

This problem happens. frequently when multiple MOS transistors with different types of gate insulating films are formed on the same semiconductor substrate. e.g., when an MOS transistor with a gate insulating film of silicon dioxide or tantalum oxide and an MOS transistor with a gate insulating film of silicon oxynitride are formed on the same semiconductor substrate.

A similar statement is also applicable to a semiconductor storage device. Specifically, if two types of capacitive insulating films, namely, tantalum oxide and silicon dioxide films, are prepared to store mutually different quantities of charge in a storage capacitor portion, then the number of masking process steps and the total number of fabricating process steps also increase. In addition, since the heat treatment should be conducted an increased number of times, the overall electrical characteristics of the device disadvantageously deteriorate.

SUMMARY OF THE INVENTION

In view of the foregoing respects, a first object of the present invention is forming MOS transistors with different types of gate insulating films without increasing the numbers of heat-treating and masking process steps. A second object of the present invention is forming a capacitor with different kinds of capacitive insulating films without increasing the numbers of heat-treating and masking process steps.

To achieve the first object, a first method for fabricating a semiconductor device according to the present invention includes the steps of: forming an isolation region on a surface portion of a semiconductor substrate of silicon, thereby defining first and second regions, which are isolated from each other by the isolation region, on the semiconductor substrate; forming a tantalum oxide film in the first region on the semiconductor substrate; forming a silicon dioxide film in the second region on the semiconductor substrate by heat-treating the semiconductor substrate within an. ambient containing oxygen as a main component; forming first and second gate electrodes on the tantalum oxide and silicon dioxide films, respectively; and forming first and second gate insulating films by etching the tantalum oxide and silicon dioxide films using the first and second gate electrodes as respective masks.

According to the first method for fabricating a semiconductor device, a semiconductor substrate, on which a tantalum oxide film has been formed in a first region, is heat-treated within an ambient containing oxygen as a main component. Thus, the tantalum oxide film is left in the first region, while a silicon dioxide film is newly formed in a second region. Thereafter, first and second gate insulating films are formed by etching the tantalum oxide and silicon dioxide films using first and second gate electrodes as respective masks. In this manner, the first and second gate insulating films can be formed out of the tantalum oxide and silicon dioxide films, respectively, on the same semiconductor substrate without increasing the number of heat-treating or masking process steps.

To achieve the first object, a second method for fabricating a semiconductor device according to the present invention includes the steps of: forming a plurality of isolation regions on respective surface portions of a semiconductor substrate of silicon, thereby defining first, second and third regions, which are isolated from each other by the isolation regions, on the semiconductor substrate; forming a tantalum oxide film and a silicon dioxide film in the first and second regions on the semiconductor substrate, respectively; forming a relatively thick silicon dioxide film and a relatively thin silicon dioxide film in the second and third regions on the semiconductor substrate, respectively, by heat-treating the semiconductor substrate within an ambient containing oxygen as a main component; forming first, second and third gate electrodes on the tantalum oxide, thick silicon dioxide and thin silicon dioxide films, respectively; and forming first, second and third gate insulating films by etching the tantalum oxide, thick silicon dioxide and thin silicon dioxide films using the first, second and third gate electrodes as respective masks.

According to the second method for fabricating a semiconductor device, a semiconductor substrate, on which a tantalum oxide film and a silicon dioxide films have been formed in first and second regions, respectively, is heat-treated within an ambient containing oxygen as a main component. Thus, the tantalum oxide film is left in the first region, the silicon dioxide film grows to form a thick silicon dioxide film in the second region and a thin silicon dioxide film is newly formed in the third region. Thereafter, first, second and third gate insulating films are formed by etching the tantalum oxide, thick silicon dioxide and thin silicon dioxide films using first, second and third gate electrodes as respective masks. In this manner, the first, second and third gate insulating films can be formed out of the tantalum oxide, thick silicon dioxide and thin silicon dioxide films, respectively, on the same semiconductor substrate without increasing the number of heat-treating or masking process steps.

To achieve the second object, a third method for fabricating a semiconductor device according to the present invention includes the steps of: forming an isolation region on a surface portion of a semiconductor substrate of silicon, thereby defining first and second regions, which are isolated from each other by the isolation region, on the semiconductor substrate; forming a capacitive lower electrode in each of the first and second regions on the semiconductor substrate; forming a silicon nitride film on the capacitive lower electrode in each of the first and second regions; forming a tantalum oxide film on the silicon nitride film in the first region, thereby forming a first capacitive insulating film as the stack of the silicon nitride and tantalum oxide films; heat-treating the semiconductor substrate within an ambient containing oxygen as a main component to form a silicon dioxide film on a surface portion of the silicon nitride film in the second region, thereby forming a second capacitive insulating film as the stack of the silicon nitride and silicon dioxide films; and forming a capacitive upper electrode on the first and second capacitive insulating films.

According to the third method for fabricating a semiconductor device, a semiconductor substrate, on which a first capacitive insulating film has been formed as a stack of silicon nitride and tantalum oxide films on a capacitive lower electrode in a first region and a silicon nitride film has been formed on a capacitive lower electrode in a second region, is heat-treated within an ambient containing oxygen as a main component. Accordingly, the first capacitive insulating film as the stack of the silicon nitride and tantalum oxide films is left in the first region, while a second capacitive insulating film is formed in the second region as a stack of the silicon nitride and silicon dioxide films. Thus, the first and second capacitive insulating films can be formed as the stack of the silicon nitride and tantalum oxide films and the stack of the silicon nitride and silicon dioxide films, respectively, on the same semiconductor substrate without increasing the number of heat-treating or masking process steps.

To achieve the first object, a fourth method for fabricating a semiconductor device according to the present invention includes the steps of: forming an isolation region on a surface portion of a semiconductor substrate of silicon, thereby defining first and second regions, which are isolated from each other by the isolation region, on the semiconductor substrate; forming a tantalum oxide film and a silicon dioxide film in the first and second regions on the semiconductor substrate, respectively; forming a tantalum nitride film in a surface portion of the tantalum oxide film and changing the silicon dioxide film into a silicon oxynitride film by heat-treating the semiconductor substrate within an ambient containing nitrogen as a main component; forming a first gate electrode on the stack of the tantalum oxide and nitride films and a second gate electrode on the silicon oxynitride film, respectively; and forming first and second gate insulating films by etching the stack of the tantalum oxide and nitride films and the silicon oxynitride film using the first and second gate electrodes as respective masks.

According to the fourth method for fabricating a semiconductor device, a semiconductor substrate, on which tantalum oxide and silicon dioxide films have been formed in first and second regions, respectively, is heat-treated within an ambient containing nitrogen as a main component. Thus, a tantalum nitride film is formed on the tantalum oxide film in the first region, while the silicon dioxide film changes into a silicon oxynitride film in the second region. Thereafter, first and second gate insulating films are formed by etching the stack of the tantalum oxide and nitride films and the silicon oxynitride film using the first and second gate electrodes as respective masks. In this manner, the first and second gate insulating films can be formed out of the stack of the tantalum oxide and nitride films and the silicon oxynitride film, respectively, on the same semiconductor substrate without increasing the number of heat-treating or masking process steps.

To achieve the first object, a fifth method for fabricating a semiconductor device according to the present invention includes the steps of: forming an isolation region on a surface portion of a semiconductor substrate of silicon, thereby defining first and second regions, which are isolated from each other by the isolation region, on the semiconductor substrate; forming a tantalum oxide film in the first region on the semiconductor substrate; forming a tantalum nitride film in a surface portion of the tantalum oxide film and a silicon oxynitride film in the second region on the semiconductor substrate, respectively, by heat-treating the semiconductor substrate within an ambient containing oxygen and nitrogen as main components; forming a first gate electrode on the stack of the tantalum oxide and nitride films and a second gate electrode on the silicon oxynitride film, respectively; and forming first and second gate insulating films by etching the stack of the tantalum oxide and nitride films and the silicon oxynitride film using the first and second gate electrodes as respective masks.

According to the fifth method for fabricating a semiconductor device, a semiconductor substrate, on which a tantalum oxide film has been formed in a first region, is heat-treated within an ambient containing oxygen and nitrogen as main components. Thus, a tantalum nitride film is formed on the tantalum oxide film in the first region, while a silicon oxynitride film is formed in the second region. Thereafter, first and second gate insulating films are formed by etching the stack of the tantalum oxide and nitride films and the silicon oxynitride film using the first and second gate electrodes as respective masks. In this manner, the first and second gate insulating films can be formed out of the stack of the tantalum oxide and nitride films and the silicon oxynitride film, respectively, on the same semiconductor substrate without increasing the number of heat-treating or masking process steps.

To achieve the first object, a sixth method for fabricating a semiconductor device according to the present invention includes the steps of: forming an isolation region on a surface portion of a semiconductor substrate of silicon, thereby defining first and second regions, which are isolated from each other by the isolation region, on the semiconductor substrate; forming a silicon nitride film in each of the first and second regions on the semiconductor substrate; forming a tantalum oxide film on the silicon nitride film in the first region; changing the silicon nitride film in the second region into a stack of the silicon nitride film and a silicon dioxide film or into a silicon oxynitride film by heat-treating the semiconductor substrate within an ambient containing oxygen as a main component; forming a first gate electrode on the stack of the silicon nitride and tantalum oxide films and a second gate electrode on the stack of the silicon nitride and silicon dioxide films or the silicon oxynitride film, respectively; and forming first and second gate insulating films by etching the stack of the silicon nitride and tantalum oxide films and the stack of the silicon nitride and silicon dioxide films or the silicon oxynitride film using the first and second gate electrodes as respective masks.

According to the sixth method for fabricating a semiconductor device, a semiconductor substrate, on which a stack of silicon nitride and tantalum oxide films has been formed in a first region and a silicon nitride film has been formed in a second region, is heat-treated within an ambient containing oxygen as a main component. Thus, the stack of the silicon nitride and tantalum oxide films is left in the first region, while the silicon nitride film changes into a stack of the silicon nitride and silicon dioxide films or a silicon oxynitride film in the second region. Thereafter, first and second gate insulating films are formed by etching the stack of the silicon nitride and tantalum oxide films and the stack of the silicon nitride and silicon dioxide films or the silicon oxynitride film using the first and second gate electrodes as respective masks. In this manner, the first and second gate insulating films can be formed out of the stack of the silicon nitride and tantalum oxide films and the stack of the silicon nitride and silicon dioxide films or the silicon oxynitride film, respectively, on the same semiconductor substrate without increasing the number of heat-treating or masking process steps.

To achieve the first object, a seventh method for fabricating a semiconductor device according to the present invention includes the steps of: forming an isolation region on a surface portion of a semiconductor substrate of silicon, thereby defining first and second regions, which are isolated from each other by the isolation region, on the semiconductor substrate; forming a silicon dioxide film in the second region on the semiconductor substrate; forming a silicon nitride film in the first region on the semiconductor substrate and changing the silicon dioxide film into a silicon oxynitride film by heat-treating the semiconductor substrate within an ambient containing nitrogen as a main component; forming a tantalum oxide film on the silicon nitride film; forming a first gate electrode on the stack of the silicon nitride and tantalum oxide films and a second gate electrode on the silicon oxynitride film, respectively; and forming first and second gate insulating films by etching the stack of the silicon nitride and tantalum oxide films and the silicon oxynitride film using the first and second gate electrodes as respective masks.

According to the seventh method for fabricating a semiconductor device, a semiconductor substrate, on which a silicon dioxide film has been formed in a second region, is heat-treated within an ambient containing nitrogen as a main component. Thus, a silicon nitride film is formed in the first region, while the silicon dioxide film changes into a silicon oxynitride film in the second region. Thereafter, a tantalum oxide film is formed on the silicon nitride film, thereby forming a stack of the silicon nitride and tantalum oxide films in the first region. Then, first and second gate insulating films are formed by etching the stack of the silicon nitride and tantalum oxide films and the silicon oxynitride film using the first and second gate electrodes as respective masks. In this manner, the first and second gate insulating films can be formed out of the stack of the silicon nitride and tantalum oxide films and the silicon oxynitride film, respectively, on the same semiconductor substrate without increasing the number of heat-treating or masking process steps.

Thus, according to the first through seventh methods for fabricating a semiconductor device, a semiconductor device, which includes MOS transistors with different types of gate insulating films or capacitors with different kinds of capacitive insulating films and does not have its performance deteriorated due to the increase in number of heat-treating process steps, can be fabricated just as intended without increasing the number of heat-treating or masking process steps.

BRIEF DESCRIPTION OF THE DRAWINGS

FIGS. 2, 3 and 4 are cross-sectional views illustrating respective process steps for fabricating a semiconductor device according to a second embodiment of the present invention.

DESCRIPTION OF THE PREFERRED EMBODIMENTS

Embodiment 1

Figure 1A:
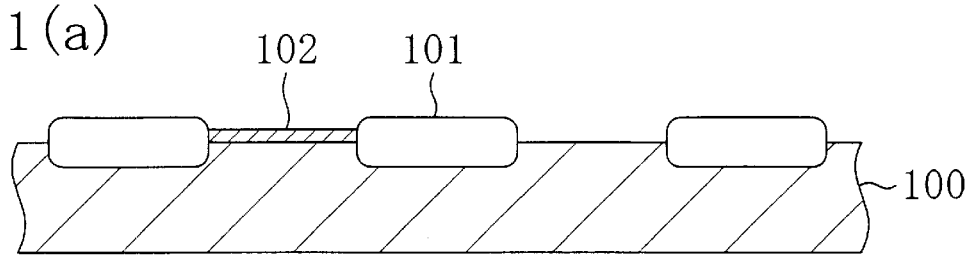
FIGS. 1(a), 1(b) and 1(c) are cross-sectional views illustrating respective process steps for fabricating a semiconductor device according to a first embodiment of the present invention.
Figure 1B:
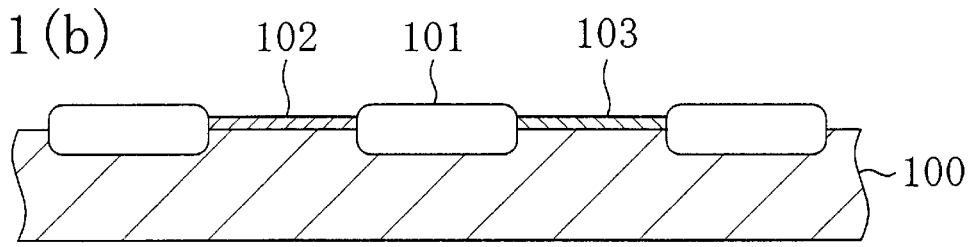
Figure 1C:
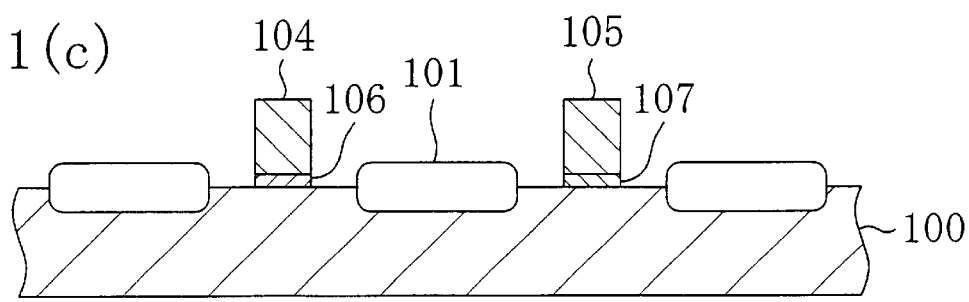

Hereinafter, a method for fabricating a semiconductor device according to a first embodiment will be described with reference to FIGS. 1(a), 1(b) and 1(c). In the method according to the first embodiment, two types of gate insulating films can be formed out of tantalum oxide and silicon dioxide films without increasing the number of masking or heat-treating process steps when MOS transistors are formed at predetermined locations on a semiconductor substrate. FIGS. 1(a) through 1(c) illustrate an embodiment where a gate insulating film is formed out of a tantalum oxide film in a first region on the left-hand side and another gate insulating film is formed out of a silicon dioxide film in a second region on the right-hand side.

First, as shown in FIG. 1(a), isolation regions 101 are defined on respective surface portions of a semiconductor substrate 100 of silicon, and then a tantalum oxide film 102 is deposited in the first region to a thickness of 10 nm, for example, by a CVD process, for instance.

Next, the semiconductor substrate 100 is heat-treated at 900° C. for 30 minutes, for example, within an ambient containing oxygen as a main component. As a result, the tantalum oxide film 102 in the first region changes from an amorphous state, in which carbon atoms causing the deterioration of the film properties exist in the film, into a crystallized state, in which those carbon atoms have been removed therefrom. In the second region on the other hand, the surface region of the semiconductor substrate 100 of silicon is oxidized to form a silicon dioxide film 103 as shown in FIG. 1(b).

Subsequently, a conductor film is deposited over the tantalum oxide and silicon dioxide films 102 and 103 and then patterned into gate electrode shapes. In this manner, first and second gate electrodes 104 and 105 are formed on the tantalum oxide and silicon dioxide films 102 and 103, respectively, as shown in FIG. 1(c). Thereafter, the tantalum oxide and silicon dioxide films 102 and 103 are etched using the first and second gate electrodes 104 and 105 as respective masks, thereby forming first and second gate insulating films 106 and 107.

As described above, according to the first embodiment, the semiconductor substrate 100, on which the tantalum oxide film 102 has been deposited in the first region, is heat-treated within the ambient containing oxygen as a main component. In this manner, the tantalum oxide film 102 is crystallized in the first region to remove carbon therefrom, while the silicon dioxide film 103 is newly formed in the second region. Thus, two types of MOS transistors with different kinds of gate insulating films can be formed on the same semiconductor substrate 100 without increasing the number of heat-treating or masking process steps.

Similar effects are attainable if the semiconductor substrate 100 is heat-treated at 900° C. for about 60 seconds, for example, using a rapid thermal annealing furnace, instead of being heat-treated at 900° C. for 30 minutes.

Embodiment 2

Figure 3:
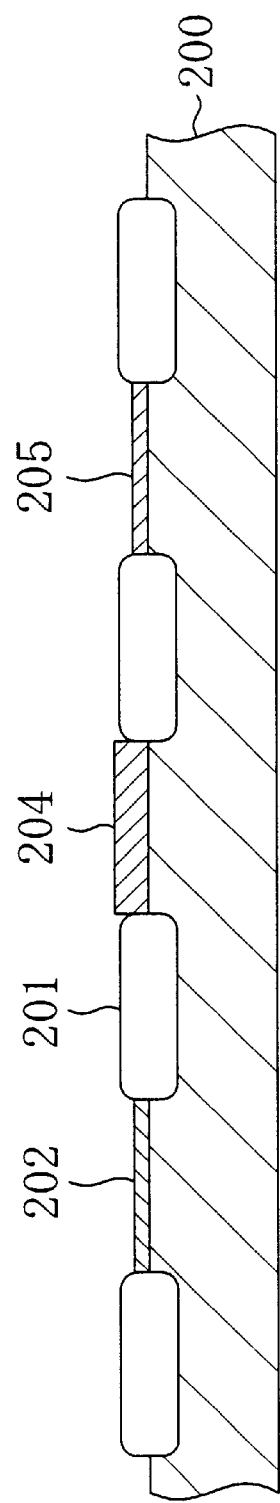

Hereinafter, a method for fabricating a semiconductor device according to a second embodiment will be described with reference to FIGS. 2 through 4. In the method according to the second embodiment, three types of gate insulating films can be formed out of tantalum oxide, thick silicon dioxide and thin silicon dioxide films without increasing the number of masking or heat-treating process steps when MOS transistors are formed at predetermined regions on a semiconductor substrate. FIGS. 2 through 4 illustrate an embodiment where a gate insulating film is formed out of the tantalum oxide film in a first region on the left-hand side, another gate insulating film is formed out of the thick silicon dioxide film in a second region at the center and still another gate insulating film is formed out of the thin silicon dioxide film in a third region on the right-hand side.

First, as shown in FIG. 2, isolation regions 201 are defined on respective surface portions of a semiconductor substrate 200 of silicon. Then, a tantalum oxide film 202 is deposited in the first region to a thickness of 10 nm, for example, by a CVD process, for instance. And a silicon dioxide film 203 is formed in the second region to a thickness of 5 nm, for example, by a thermal oxidation or CVD process.

Next, the semiconductor substrate 200 is heat-treated at 900° C. for 30 minutes, for example, within an ambient containing oxygen as a main component. As a result, the tantalum oxide film 202 in the first region changes from an amorphous state, in which carbon atoms causing the deterioration of the film properties exist in the film, into a crystallized state, in which those carbon atoms have been removed therefrom. In the second region on the other hand, the silicon dioxide film 203 grows to a thickness of about 15 nm to form a thick silicon dioxide film 204. Furthermore, in the third region, the surface region of the semiconductor substrate 200 of silicon is oxidized to form a thin silicon dioxide film 205 with a thickness of about 10 nm as shown in FIG. 3.

Subsequently, a conductor film is deposited over the entire surface including the tantalum, thick silicon dioxide and thin silicon dioxide films 202, 204 and 205 and then patterned into gate electrode shapes. In this manner, first, second and third gate electrodes 206, 207 and 208 are formed on the tantalum oxide, thick silicon dioxide and thin silicon dioxide films 202, 204 and 205, respectively, as shown in FIG. 4. Thereafter, the tantalum oxide, thick silicon dioxide and thin silicon dioxide films 202, 204 and 205 are etched using the first, second and third gate electrodes 206, 207 and 208 as masks, thereby forming first, second and third gate insulating films 209, 210 and 211, respectively.

As described above, according to the second embodiment, the semiconductor substrate 200, on which the tantalum oxide and silicon dioxide films 202 and 203 have been formed in the first and second regions, respectively, is heat-treated within the ambient containing oxygen as a main component. In this manner, the tantalum oxide film 202 is crystallized in the first region to remove carbon therefrom, the silicon dioxide film 203 is grown into the thick silicon dioxide film 204 in the second region and the thin silicon dioxide film 205 is newly formed in the third region. Accordingly, three types of MOS transistors with gate insulating films of different kinds or thicknesses can be formed on the same semiconductor substrate 200 without increasing the number of heat-treating or masking process steps.

Similar effects are attainable if the semiconductor substrate 200 is heat-treated at 900° C. for about 60 seconds, for example, using a rapid thermal annealing furnace, instead of being heat-treated at 900° C. for 30 minutes.

Alternatively, the thick and thin silicon dioxide films 204 and 205 may be formed in the following manner. First, a mask is defined over the third region of the semiconductor substrate 200. Then, the semiconductor substrate 200 is heat-treated within an ambient containing oxygen as a main component, thereby forming the silicon dioxide film 203 in the second region. Thereafter, the mask is removed and then the semiconductor substrate 200 is heat-treated again within the ambient containing oxygen as a main component such that the thick and thin silicon dioxide films 204 and 205 are formed in the second and third regions, respectively.

Embodiment 3

Hereinafter, a method for fabricating a semiconductor device according to a third embodiment will be described with reference to FIGS. 5(a), 5(b) and 5(c) and FIGS. 6(a) and 6(b). In the method according to the third embodiment, two types of capacitive insulating films can be formed out of a stack of tantalum oxide and silicon nitride films and a stack of silicon dioxide and nitride films, respectively, without increasing the number of masking or heat-treating process steps when a storage capacitor portion is formed for a semiconductor storage device at a predetermined region on a semiconductor substrate. FIGS. 5(a) through 5(c) and FIGS. 6(a) and 6(b) illustrate an embodiment where a capacitive insulating film is formed out of a stack of silicon nitride and tantalum oxide films in a first region on the left-hand side and another capacitive insulating film is formed out of a stack of silicon nitride and silicon dioxide films in a second region on the right-hand side.

Figure 5A:
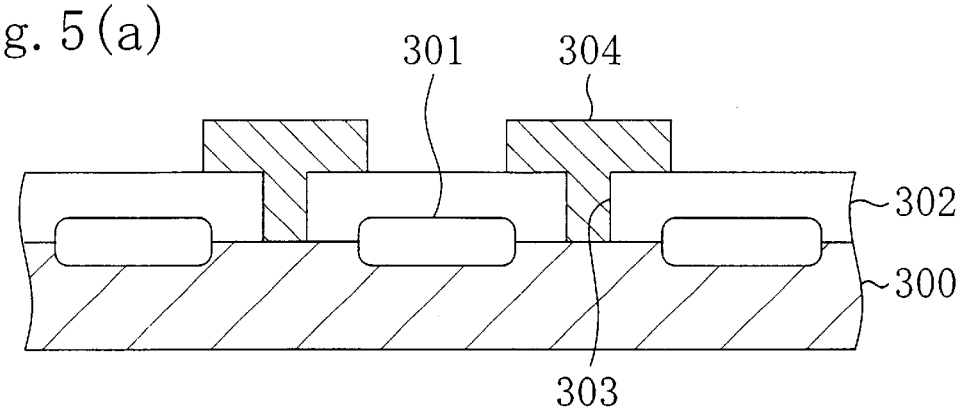
FIGS. 5(a), 5(b) and 5(c) are cross-sectional views illustrating respective process steps for fabricating a semiconductor device according to a third embodiment of the present invention.

First, as shown in FIG. 5(a), isolation regions 301 are defined on respective surface portions of a semiconductor substrate 300 of silicon, an interlevel dielectric film 302 is deposited over the entire surface thereof and then contact holes 303 are formed in the interlevel dielectric film 302. Next, a conductive polysilicon film is deposited to a thickness of 500 nm, for example, over the entire surface of the interlevel dielectric film 302 and then patterned, thereby forming capacitive lower electrodes 304.

Figure 5B:
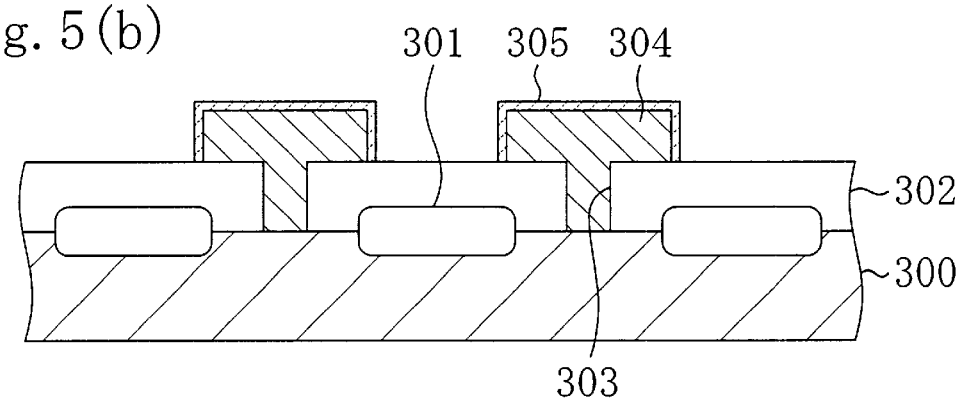

Then, respective surface regions of the capacitive lower electrodes 304 are nitrided or a silicon nitride film is deposited thereon by a CVD process. As a result, a silicon nitride film 305 is formed to a thickness of 6 nm, for example, on the surface of each capacitive lower electrode 304 as shown in FIG. 5(b).

Figure 5C:
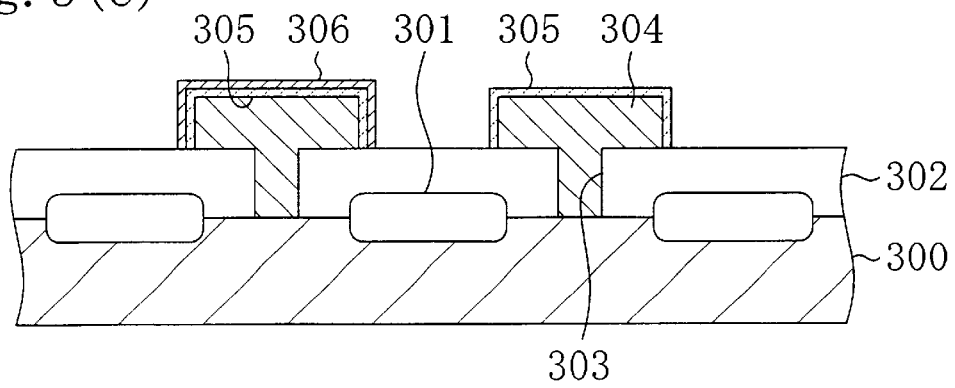

Subsequently, as shown in FIG. 5(c), a tantalum oxide film 306 is selectively deposited to a thickness of 10 nm, for example, on the silicon nitride film 305 that has been formed in the first region. In this manner, a capacitive insulating film is formed as stack of the silicon nitride and tantalum oxide films 305 and 306.

Figure 6A:
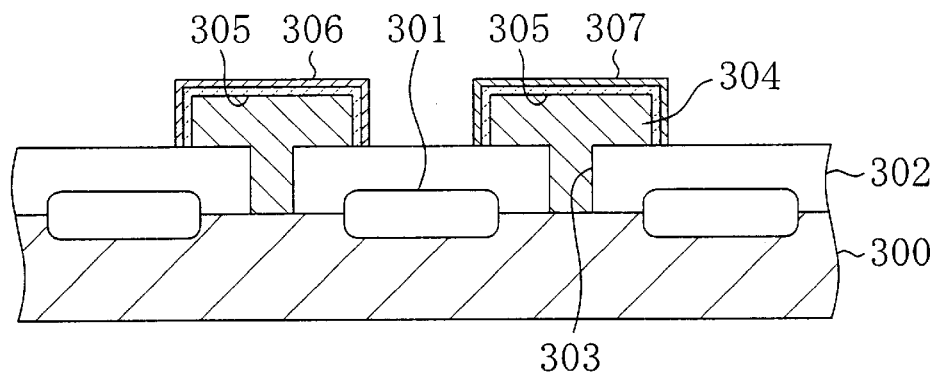
FIGS. 6(a) and 6(b) are cross-sectional views illustrating respective process steps for fabricating the semiconductor device according to the third embodiment of the present invention.

Next, the semiconductor substrate 300 is heat-treated at 900° C. for 30 minutes, for example, within an ambient containing oxygen as a main component. As a result, the tantalum oxide film 306 in the first region changes from an amorphous state, in which carbon atoms causing the deterioration of the film properties exist in the film, into a crystallized state, in which those carbon atoms have been removed therefrom. In the second region on the other hand, the surface region of the silicon nitride film 305 is oxidized to form a capacitive insulating film as a stack of the silicon nitride and silicon dioxide films 305 and 307 as shown in FIG. 6(a).

Figure 6B:
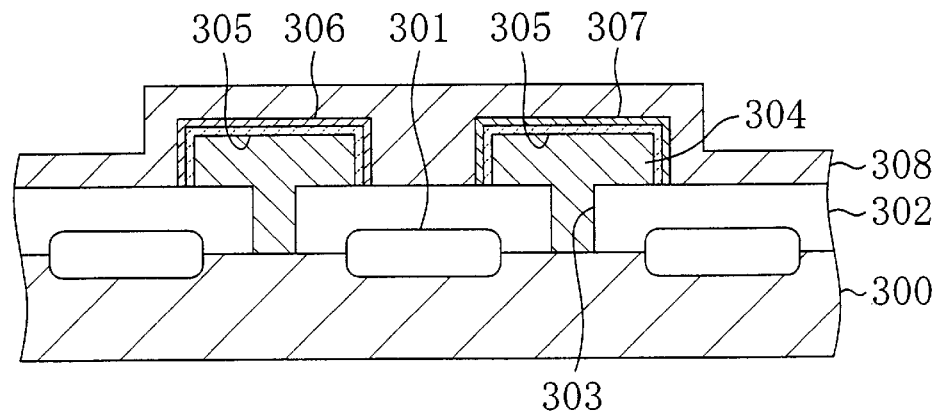

Next, a conductive polysilicon film is deposited over the entire surface of the semiconductor substrate 300 and then patterned to form a capacitive upper electrode 308 as shown in FIG. 6(b).

As described above, according to the third embodiment, the semiconductor substrate 300, on which the tantalum oxide film 306 has been formed in the first region and the silicon nitride film 305 has been formed in the second region, is heat-treated within the ambient containing oxygen as a main component. In this manner, the tantalum oxide film 306 is crystallized in the first region to remove carbon therefrom, while the stack of the silicon nitride and silicon dioxide films 305 and 307 is formed in the second region. Thus, two types of semiconductor storage devices with different kinds of capacitive insulating films can be formed on the same semiconductor substrate 300 without increasing the number of heat-treating or masking process steps.

Similar effects are attainable if the semiconductor substrate 300 is heat-treated at 900° C. for about 60 seconds, for example, using a rapid thermal annealing furnace, instead of being heat-treated at 900° C. for 30 minutes.

Embodiment 4

Figure 7A:
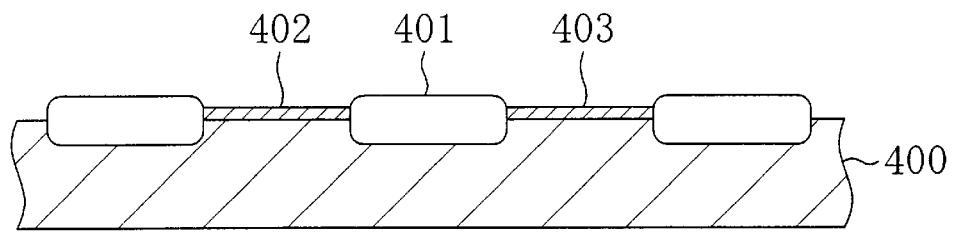
FIGS. 7(a), 7(b) and 7(c) are cross-sectional views illustrating respective process steps for fabricating a semiconductor device according to a fourth embodiment of the present invention.
Figure 7B:
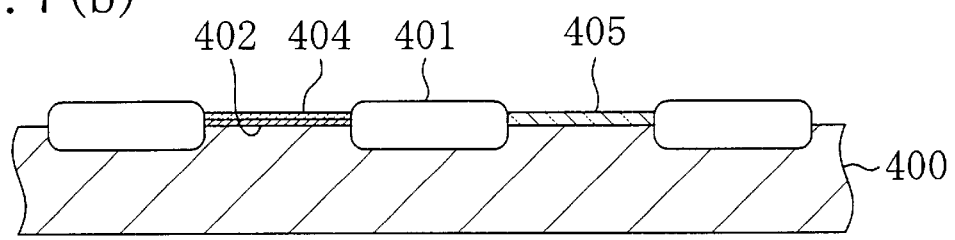
Figure 7C:
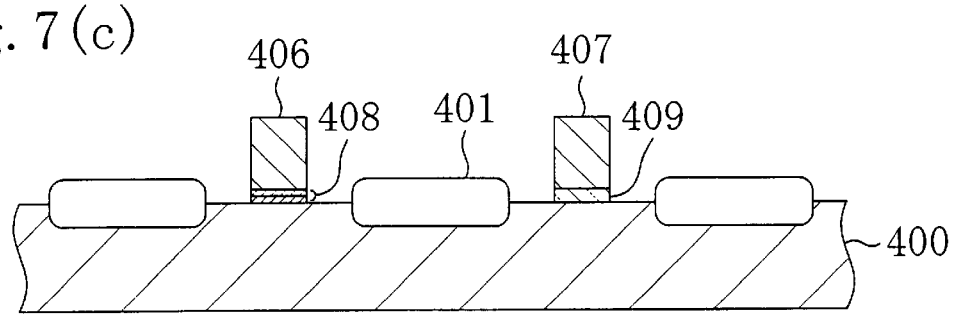

Hereinafter, a method for fabricating a semiconductor device according to a fourth embodiment will be described with reference to FIGS. 7(a), 7(b) and 7(c). In the method according to the fourth embodiment, two types of gate insulating films can be formed out of a stack of tantalum nitride and oxide films and a silicon oxynitride film without increasing the number of masking or heat-treating process steps when MOS transistors are formed at predetermined locations on a semiconductor substrate. FIGS. 7(a) through 7(c) illustrate an embodiment where a gate insulating film with good barrier properties is formed out of a stack of the tantalum nitride and oxide films in a first region on the left-hand side and another gate insulating film is formed out of the silicon oxynitride film in a second region on the right-hand side.

First, as shown in FIG. 7(a), isolation regions 401 are defined on respective surface portions of a semiconductor substrate 400 of silicon. Then, a tantalum oxide film 402 is deposited in the first region to a thickness of 10 nm, for example, by a CVD process, for instance, and a silicon dioxide film 403 is deposited in the second region to a thickness of 3 nm, for example.

Next, the semiconductor substrate 400 is heat-treated at 900° C. for 10 minutes, for example, within an ambient containing nitrogen as a main component, e.g., ammonium ambient. As a result, a tantalum nitride film 404 is formed on the surface of the tantalum oxide film 402 in the first region, while the silicon dioxide film 403 changes into a silicon oxynitride film 405 in the second region. In this case, the tantalum oxide film 402 in the first region changes from an amorphous state, in which carbon atoms exist in the film, into a crystallized state, in which those carbon atoms have been removed therefrom.

Subsequently, a conductor film is deposited over the stack of the tantalum oxide and nitride films 402 and 404 and over the silicon oxynitride film 405 and then patterned into gate electrode shapes. In this manner, first and second gate electrodes 406 and 407 are formed on the stack of the tantalum oxide and nitride films 402 and 404 and on the silicon oxynitride film 405, respectively, as shown in FIG. 7(c). Thereafter, the stack of the tantalum oxide and nitride films 402 and 404 and the silicon oxynitride film 405 are etched using the first and second gate electrodes 406 and 407 as respective masks, thereby forming first and second gate insulating films 408 and 409.

As described above, according to the fourth embodiment, the semiconductor substrate 400, on which the tantalum oxide film 402 and silicon dioxide film 403 have been formed in the first and second regions, respectively, is heat-treated within the ambient containing nitrogen as a main component, e.g., ammonium ambient. In this manner, the tantalum oxide film 402 is crystallized in the first region to remove carbon therefrom and the tantalum nitride film 404 is formed on the tantalum oxide film 402. On the other hand, the silicon dioxide film 403 is changed into the silicon oxynitride film 405 in the second region. Thus, two types of MOS transistors with different kinds of gate insulating films can be formed on the same semiconductor substrate 400 without increasing the number of heat-treating or masking process steps.

Similar effects are attainable if the semiconductor substrate 400 is heat-treated within an ambient containing nitrogen gas instead of ammonium.

Also, the tantalum oxide and silicon dioxide films 402 and 403 shown in FIG. 7(a) may be formed by the method according to the first embodiment.

Embodiment 5

Figure 8A:
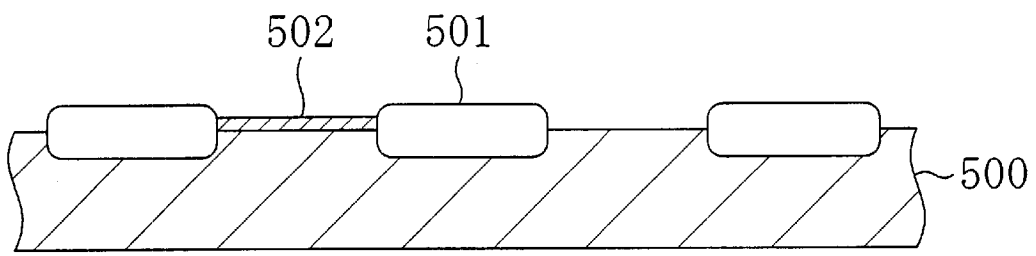
FIGS. 8(a) and 8(b) are cross-sectional views illustrating respective process steps for fabricating a semiconductor device according to a fifth embodiment of the present invention.
Figure 8B:
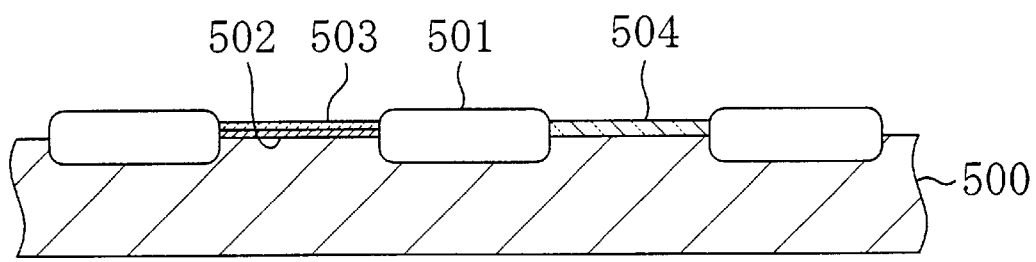

Hereinafter, a method for fabricating a semiconductor device according to a fifth embodiment will be described with reference to FIGS. 8(a) and 8(b). In the method according to the fifth embodiment, two types of gate insulating films can be formed out of a stack of tantalum oxide and nitride films and a silicon oxynitride film without increasing the number of masking or heat-treating process steps when MOS transistors are formed at predetermined locations on a semiconductor substrate. FIGS. 8(a) and 8(b) illustrate an embodiment where a gate insulating film with good barrier properties is formed out of the stack of the tantalum oxide and nitride films in a first region on the left-hand side and another gate insulating film is formed out of the silicon oxynitride film in a second region on the right-hand side.

First, as shown in FIG. 8(a), isolation regions 501 are defined on respective surface portions of a semiconductor substrate 500 of silicon. Then, a tantalum oxide film 502 is deposited in the first region to a thickness of 10 nm, for example, by a CVD process, for instance.

Next, the semiconductor substrate 500 is heat-treated at 900° C. for 10 minutes, for example, within an ambient containing oxygen and nitrogen as main components, e.g., an ambient containing nitrogen monoxide gas. As a result, a tantalum nitride film 503 with barrier properties is formed in the first region on the surface of the tantalum oxide film 502 as shown in FIG. 8(b). In addition, the tantalum oxide film 502 changes from an amorphous state, in which carbon atoms exist in the film, into a crystallized state, in which those carbon atoms have been removed therefrom. In the second region on the other hand, the surface region of the semiconductor substrate 500 is oxidized and nitrided to form a silicon oxynitride film 504 to a thickness of 15 nm.

Subsequently, although not shown, the first and second gate electrodes and first and second gate insulating films are formed as is done in the fourth embodiment.

As described above, according to the fifth embodiment, the semiconductor substrate 500, on which the tantalum oxide film 502 has been formed in the first region, is heat-treated within the ambient containing oxygen and nitrogen as main components, e.g., nitrogen monoxide ambient. In this manner, the tantalum oxide film 502 is crystallized in the first region to remove carbon therefrom and the tantalum nitride film 503 is formed on the tantalum oxide film 502. In the second region on the other hand, the silicon oxynitride film 504 is formed. Thus, two types of MOS transistors with different kinds of gate insulating films can be formed on the same semiconductor substrate 500 without increasing the number of heat-treating or masking process steps.

Similar effects are attainable if the semiconductor substrate 500 is heat-treated at 900° C. for about 30 seconds, for example, using a rapid thermal annealing furnace, instead of being heat-treated at 900° C. for 10 minutes. Similar effects are also attainable even if the semiconductor substrate 500 is heat-treated within an ambient containing nitrogen dioxide gas, not the nitrogen monoxide ambient.

Embodiment 6

Figure 9A:
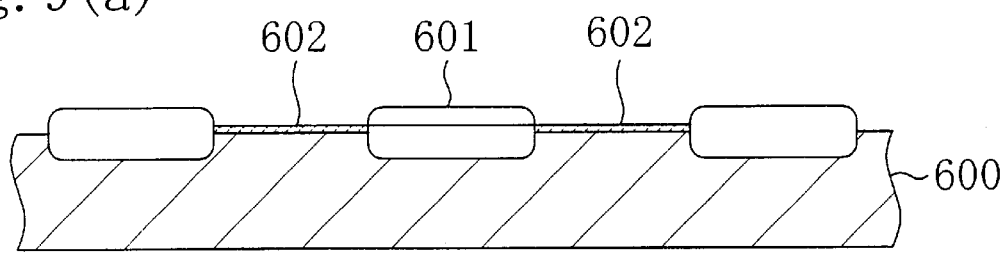
FIGS. 9(a), 9(b) and 9(c) are cross-sectional views illustrating respective process steps for fabricating a semiconductor device according to a sixth embodiment of the present invention.
Figure 9B:
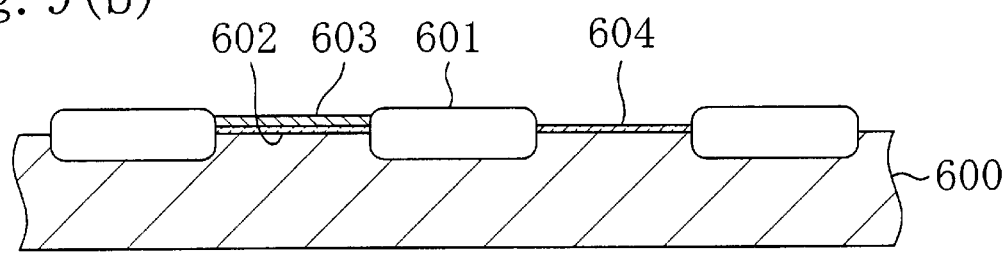
Figure 9C:
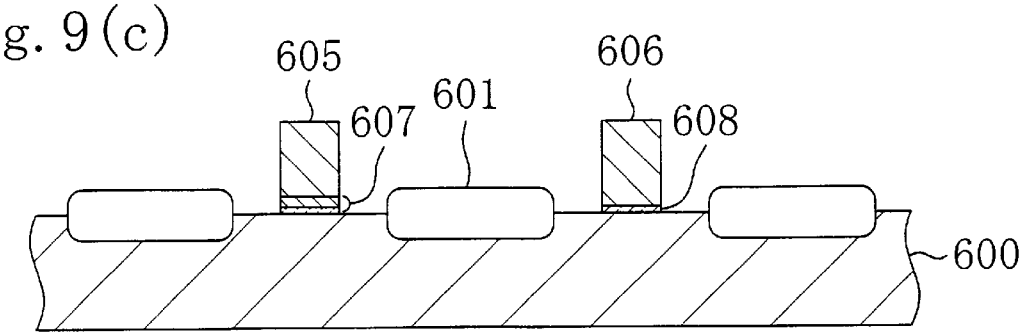

Hereinafter, a method for fabricating a semiconductor device according to a sixth embodiment will be described with reference to FIGS. 9(a), 9(b) and 9(c). In the method according to the sixth embodiment, two types of gate insulating films can be formed out of a stack of tantalum oxide and silicon nitride films and a silicon oxynitride film without increasing the number of masking or heat-treating process steps when MOS transistors are formed at predetermined locations on a semiconductor substrate. FIGS. 9(a) through 9(c) illustrate an embodiment where a gate insulating film with good barrier properties is formed out of the stack of the tantalum oxide and silicon nitride films in a first region on the left-hand side and another gate insulating film is formed out of the silicon oxynitride film in a second region on the right-hand side.

First, as shown in FIG. 9(a), isolation regions 601 are defined on respective surface portions of a semiconductor substrate 600 of silicon. Then, the semiconductor substrate 600 is heat-treated at 900° C. for 10 minutes, for example, within an ambient containing nitrogen as a main component, e.g., ammonium ambient, thereby forming a silicon nitride film 602 in the first region.

Next, as shown in FIG. 9(b), a tantalum oxide film 603 is selectively deposited to a thickness of 10 nm, for example, on the silicon nitride film 602 in the first region by a CVD process, for instance. Thereafter, the semiconductor substrate 600 is heat-treated at 900° C. for 30 minutes, for example, within an ambient containing oxygen as a main component. As a result, the tantalum oxide film 603 in the first region changes from an amorphous state, in which carbon atoms exist in the film, into a crystallized state, in which those carbon atoms have been removed therefrom. In the second region on the other hand, the silicon nitride film 602 changes into a silicon oxynitride film 604 or a stack of silicon nitride and dioxide films.

Subsequently, a conductor film is deposited over the stack of the silicon nitride and tantalum oxide films 602 and 603 and over the silicon oxynitride film 604 and then patterned into gate electrode shapes. In this manner, first and second gate electrodes 605 and 606 are formed on the stack of the silicon nitride and tantalum oxide films 602 and 603 and on the silicon oxynitride film 604, respectively, as shown in FIG. 9(c). Thereafter, the stack of the silicon nitride and tantalum oxide films 602 and 603 and the silicon oxynitride film 604 are etched using the first and second gate electrodes 605 and 606 as respective masks, thereby forming first and second gate insulating films 607 and 608.

As described above, according to the sixth embodiment, the semiconductor substrate 600, on which the stack of the silicon nitride and tantalum oxide films 602 and 603 has been formed in the first region, is heat-treated within the ambient containing oxygen as a main component. In this manner, the tantalum oxide film 603 is crystallized in the first region to remove carbon therefrom. In the second region on the other hand, the silicon nitride film 602 is changed into the silicon oxynitride film 604. Thus, two types of MOS transistors with different kinds of gate insulating films can be formed on the same semiconductor substrate 600 without increasing the number of heat-treating or masking process steps.

Similar effects are attainable if the semiconductor substrate 600 is heat-treated at 900° C. for about 30 seconds, for example, using a rapid thermal annealing furnace, instead of being heat-treated at 900° C. for 10 minutes. Similar effects are also attainable even if the semiconductor substrate 600 is heat-treated within an ambient containing nitrogen gas or nitrogen oxide gas, not the ambient containing ammonium.

Embodiment 7

Figure 10A:
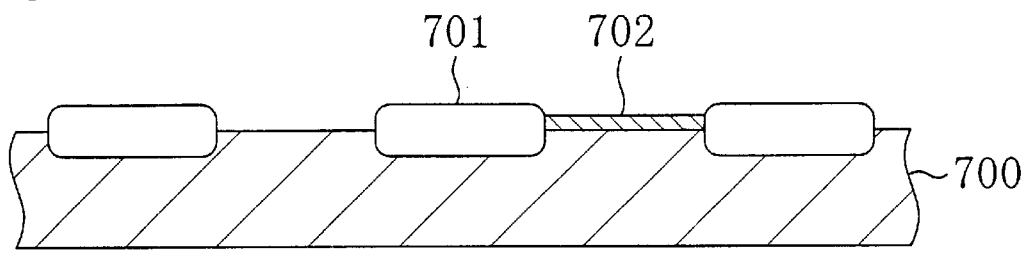
FIGS. 10(a) and 10(b) are cross-sectional views illustrating respective process steps for fabricating a semiconductor device according to a seventh embodiment of the present invention.
Figure 10B:
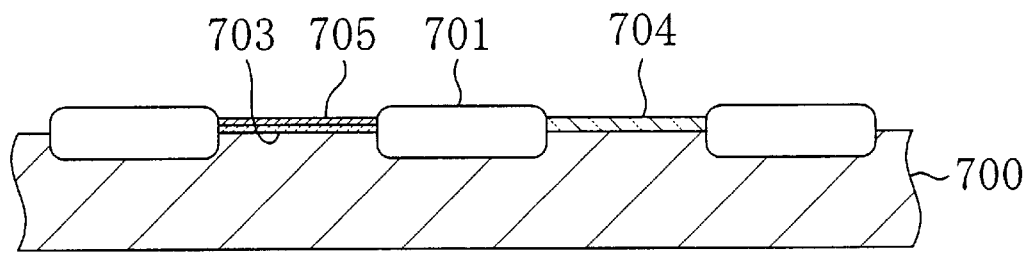
Figure 11A:
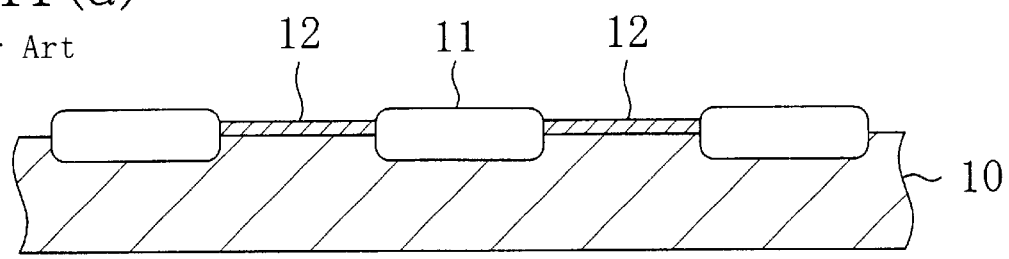
FIGS. 11(a), 11(b), 11(c) and 11(d) are cross-sectional views illustrating respective process steps for fabricating a semiconductor device according to a first prior art example.
Figure 11B:
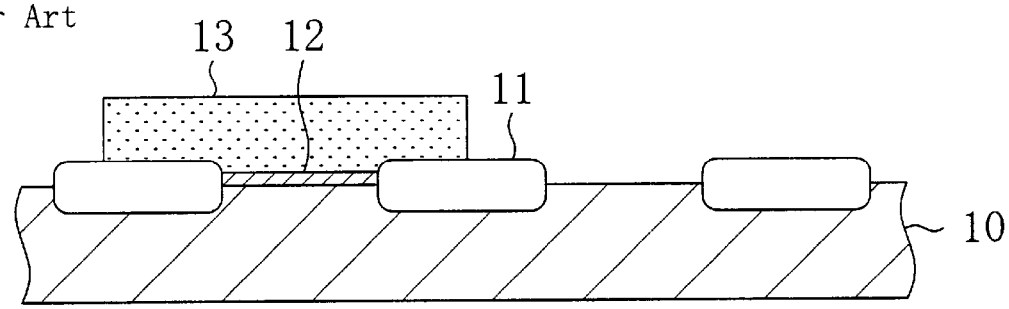
Figure 11C:
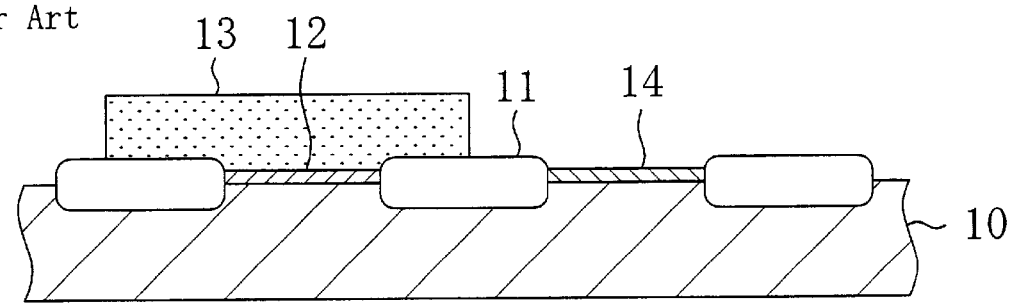
Figure 11D:
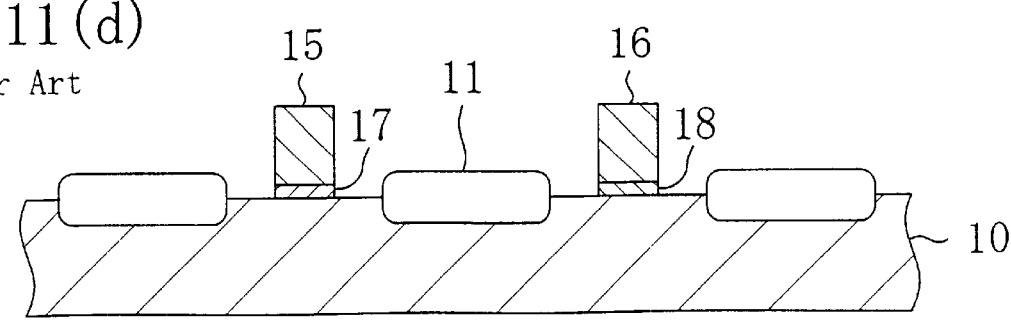
Figure 12:
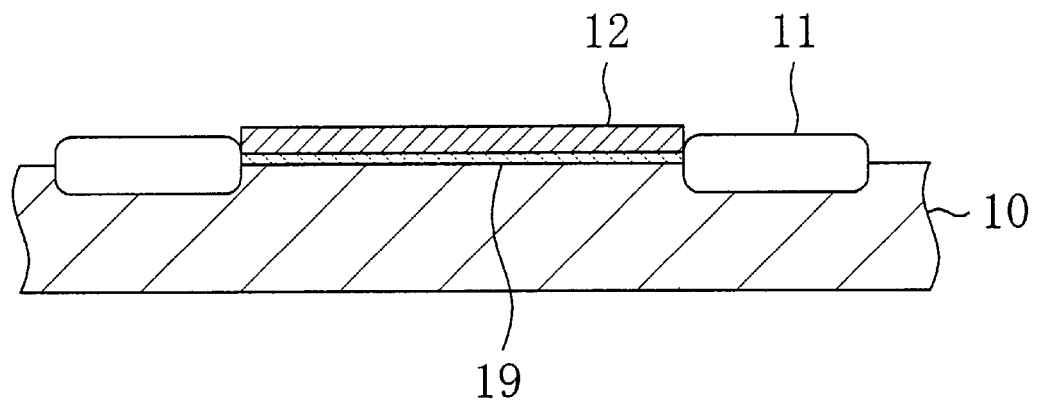
FIG. 12 is a cross-sectional view illustrating a process step for fabricating a semiconductor device according to a second prior art example.

Hereinafter, a method for fabricating a semiconductor device according to a seventh embodiment will be described with reference to FIGS. 10(a) and 10(b). In the method according to the seventh embodiment, two types of gate insulating films can be formed out of a stack of tantalum oxide and silicon nitride films and a silicon oxynitride film without increasing the number of masking or heat-treating process steps when MOS transistors are formed at predetermined locations on a semiconductor substrate. FIGS. 10(a) and 10(b) illustrate an embodiment where a gate insulating film with good barrier properties is formed out of the stack of the tantalum oxide and silicon nitride films in a first region on the left-hand side and another gate insulating film is formed out of the silicon oxynitride film in a second region on the right-hand side.

First, as shown in FIG. 10(a), isolation regions 701 are defined on respective surface portions of a semiconductor substrate 700 of silicon. Then, a silicon dioxide film 702 is deposited in the second region to a thickness of 3 nm, for example.

Next, the semiconductor substrate 700 is heat-treated at 900° C. for 10 minutes, for example, within an ambient containing nitrogen as a main component, e.g., ammonium ambient. As a result, the surface region of the semiconductor substrate 700 is nitrided to form a silicon nitride film 703 in the first region. In the second region on the other hand, the silicon dioxide film 702 is nitrided and changed into a silicon oxynitride film 704. Thereafter, a tantalum oxide film 705 is deposited on the silicon nitride film 703 in the first region by a CVD process, for example.

Subsequently, although not shown, the first and second gate electrodes and first and second gate insulating films are formed as in the sixth embodiment.

As described above, according to the seventh embodiment, after the silicon dioxide film 702 has been formed in the second region, heat treatment is conducted within the ambient containing nitrogen as a main component, e.g., ammonium ambient. As a result, the surface region of the semiconductor substrate 700 is nitrided in the first region to form the silicon nitride film 703. In the second region on the other hand, the silicon dioxide film 702 changes into the silicon oxynitride film 704. Thereafter, the tantalum oxide film 705 is deposited on the silicon nitride film 703 in the first region. Thus, two types of MOS transistors with different kinds of gate insulating films can be formed on the same semiconductor substrate 700 without increasing the number of heat-treating or masking process steps.

Similar effects are attainable if the semiconductor substrate 700 is heat-treated at 900° C. for about 30 seconds, for example, using a rapid thermal annealing furnace, instead of being heat-treated at 900° C. for 10 minutes. Similar effects are also attainable even if the semiconductor substrate 700 is heat-treated within an ambient containing nitrogen gas or nitrogen oxide gas, not the ammonium ambient.

What is claimed is:

1. A method for fabricating a semiconductor device, comprising the steps of:

forming an isolation region on a surface portion of a semiconductor substrate of silicon, thereby defining first and second regions, which are isolated from each other by the isolation region, on the semiconductor substrate;

forming a tantalum oxide film only in the first region on the semiconductor substrate;

forming a silicon dioxide film in the second region on the semiconductor substrate by heat-treating the semiconductor substrate within an ambient containing oxygen as a main component;

forming first and second gate electrodes on the tantalum oxide and silicon dioxide films, respectively; and forming first and second gate insulating films by etching the tantalum oxide and silicon dioxide films using the first and second gate electrodes as respective masks.

2. A method for fabricating a semiconductor device, comprising the steps of:

forming a plurality of isolation regions on respective surface portions of a semiconductor substrate of silicon, thereby defining first, second and third regions, which are isolated from each other by the isolation regions, on the semiconductor substrate;

forming a tantalum oxide film and a silicon dioxide film only in the first and second regions on the semiconductor substrate, respectively;

forming a relatively thick silicon dioxide film and a relatively thin silicon dioxide film in the second and third regions on the semiconductor substrate, respectively, by heat-treating the semiconductor substrate within an ambient containing oxygen as a main component;

forming first, second and third gate electrodes on the tantalum oxide, thick silicon dioxide and thin silicon dioxide films, respectively; and forming first, second and third gate insulating films by etching the tantalum oxide, thick silicon dioxide and thin silicon dioxide films using the first, second and third gate electrodes as respective masks.

3. A method for fabricating a semiconductor device, comprising the steps of:

forming an isolation region on a surface portion of a semiconductor substrate of silicon, thereby defining first and second regions, which are isolated from each other by the isolation region, on the semiconductor substrate;

forming a silicon nitride film in each of the first and second regions on the semiconductor substrate;

forming a tantalum oxide film only on the silicon nitride film in the first region;

changing the silicon nitride film in the second region into a stack of the silicon nitride film and a silicon dioxide film or into a silicon oxynitride film by heat-treating the semiconductor substrate within an ambient containing oxygen as a main component;

forming a first gate electrode on the stack of the silicon nitride and tantalum oxide films and a second gate electrode on the stack of the silicon nitride and silicon dioxide films or the silicon oxynitride film, respectively; and forming first and second gate insulating films by etching the stack of the silicon nitride and tantalum oxide films and the stack of the silicon nitride and silicon dioxide films or the silicon oxynitride film using the first and second gate electrodes as respective masks.

* * * * *

UNITED STATES PATENT AND TRADEMARK OFFICE
CERTIFICATE OF CORRECTION

PATENT NO. : 6,461,919 B1
DATED : October 8, 2002
INVENTOR(S) : Yoshiyuki Shibata It is certified that error appears in the above-identified patent and that said Letters Patent is hereby corrected as shown below:

<u>Title page,</u>
Item [54], Title, delete "METHOD FOR FABRICATING SEMICONDUCTOR DEVICE WITH DIFFERENT GATE OXIDE COMPOSITIONS" add -- METHOD FOR FABRICATING SEMICONDUCTOR DEVICE --
Item [73], Assignee, delete "Matsushita Electronics Corporation" add -- Matsushita Electric Industrial Co., Ltd. --.

Signed and Sealed this

Eleventh Day of March, 2003

JAMES E. ROGAN
*Director of the United States Patent and Trademark Office*